(12) United States Patent
Taylor

(10) Patent No.: US 7,627,060 B2
(45) Date of Patent: Dec. 1, 2009

(54) RECEIVER AND METHOD HAVING ENVELOPE COMPENSATION SIGNAL

(75) Inventor: Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 11/386,199

(22) Filed: Mar. 21, 2006

(65) Prior Publication Data

US 2007/0223630 A1 Sep. 27, 2007

(51) Int. Cl.
H04L 27/00 (2006.01)
(52) U.S. Cl. .......................... 375/324; 375/345; 375/346
(58) Field of Classification Search .................. 375/324, 375/345, 346
See application file for complete search history.

(56) References Cited

U.S. PATENT DOCUMENTS

| | | | | |
|---|---|---|---|---|
| 5,451,948 A * | 9/1995 | Jekel | ............................ | 341/139 |
| 5,559,866 A * | 9/1996 | O'Neill | ....................... | 455/447 |
| 5,594,612 A | 1/1997 | Henrion | | |
| 6,433,835 B1 * | 8/2002 | Hartson et al. | .............. | 348/608 |
| 6,823,181 B1 * | 11/2004 | Kohno et al. | ................. | 455/324 |
| 6,888,409 B1 | 5/2005 | Taylor | | |
| 7,295,645 B1 * | 11/2007 | El-Ghoroury et al. | ........ | 375/345 |
| 2004/0077324 A1 * | 4/2004 | Wieck | ...................... | 455/234.1 |
| 2004/0242180 A1 * | 12/2004 | Beach et al. | ................. | 455/323 |
| 2005/0250459 A1 * | 11/2005 | Tervaluoto et al. | ........ | 455/127.2 |
| 2006/0111050 A1 * | 5/2006 | Choi et al. | ................ | 455/67.11 |

OTHER PUBLICATIONS

Tsurumi, "Broadband RF Stage Architecture for Software-Defined Radio in Handheld Terminal Applications", IEEE Communications Magazine Feb. 1999 pp. 37(2):90-95.*
Chen, "Adaptive compensation of even-order distortion in direct conversion receivers", this paper appears in: Vehicular Technology Conference, 2003, VTC 2003 Fall, 2003 IEEE 58th Publication Date: Oct. 6-9, 2003, vol. 1, on pp. 271-274 vol. 1.*
Chen "A 5-GHz direct-conversion receiver with I/Q phase and gain error calibration [WLAN applications]", Radio Frequency integrated Circuits (RFIC) Symposium, 2005. Digest of Papers. 2005 IEEE Jun. 12-14, 2005 pp. 201-204.*
Durdodt, "Comparison of an inductorless low-IF and zero-IF receiver for Bluetooth", the 2002 45th Midwest Symposium on Circuits and Systems, 2002, MWSCAS-2002, vol. 1, Aug. 4-7, 2002 pp. I-563-6 vol. 1.*
Rogin, "A 1.5-V 45-mW direct-conversion WCDMA receiver IC in 0.13-µm CMOS", IEEE Journal of Solid-State Circuits, vol. 38, Issue 12, Dec. 2003 pp. 2239-2248.*
Nosal, Zbigniew M., "Intermodulation Reduction Concept for Cascode RF Amplifiers," IEEE, 2005, 4 pgs.

* cited by examiner

Primary Examiner—Juan A Torres
(74) Attorney, Agent, or Firm—Schwabe, Williamson & Wyatt, P.C.

(57) ABSTRACT

In some embodiments, methods and apparatus to reduce non-linearity in a receiver are generally described herein. Other embodiments may be described and claimed.

23 Claims, 7 Drawing Sheets

RECEIVER AND METHOD HAVING ENVELOPE COMPENSATION SIGNAL

BACKGROUND

1. Technical Field

Embodiments of the present invention are related to the field of data communication, and in particular, to receiving communication devices.

2. Description of Related Art

A typical receiver for a radio frequency signal (RF signal) includes at least a combination of an amplifier and a mixer for signal amplification and frequency conversion. There may be multiple amplifiers and mixers in a signal receive path of a receiver. The amplifiers in the signal-receive path may introduce nonlinearities into the processed RF signal, which may affect a baseband signal provided by the receiver. For example, although the output y of an ideal amplifier is related to its input x by the linear equation y=gx (where g is the gain of the amplifier), the relationship between the input and output of a real amplifier may be characterized by the equation $y = a_0 + a_1 x + a_2 x^2 + a_3 x^3 + \ldots$, where the power terms (e.g., $a_2 x^2 + a_3 x^3$) represent nonlinear distortion introduced by the real amplifier. Other real signal processing devices introduce similar nonlinear distortion into their output. As a result, the outputs of real signal processing devices differ from the desired, ideal outputs.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 1:
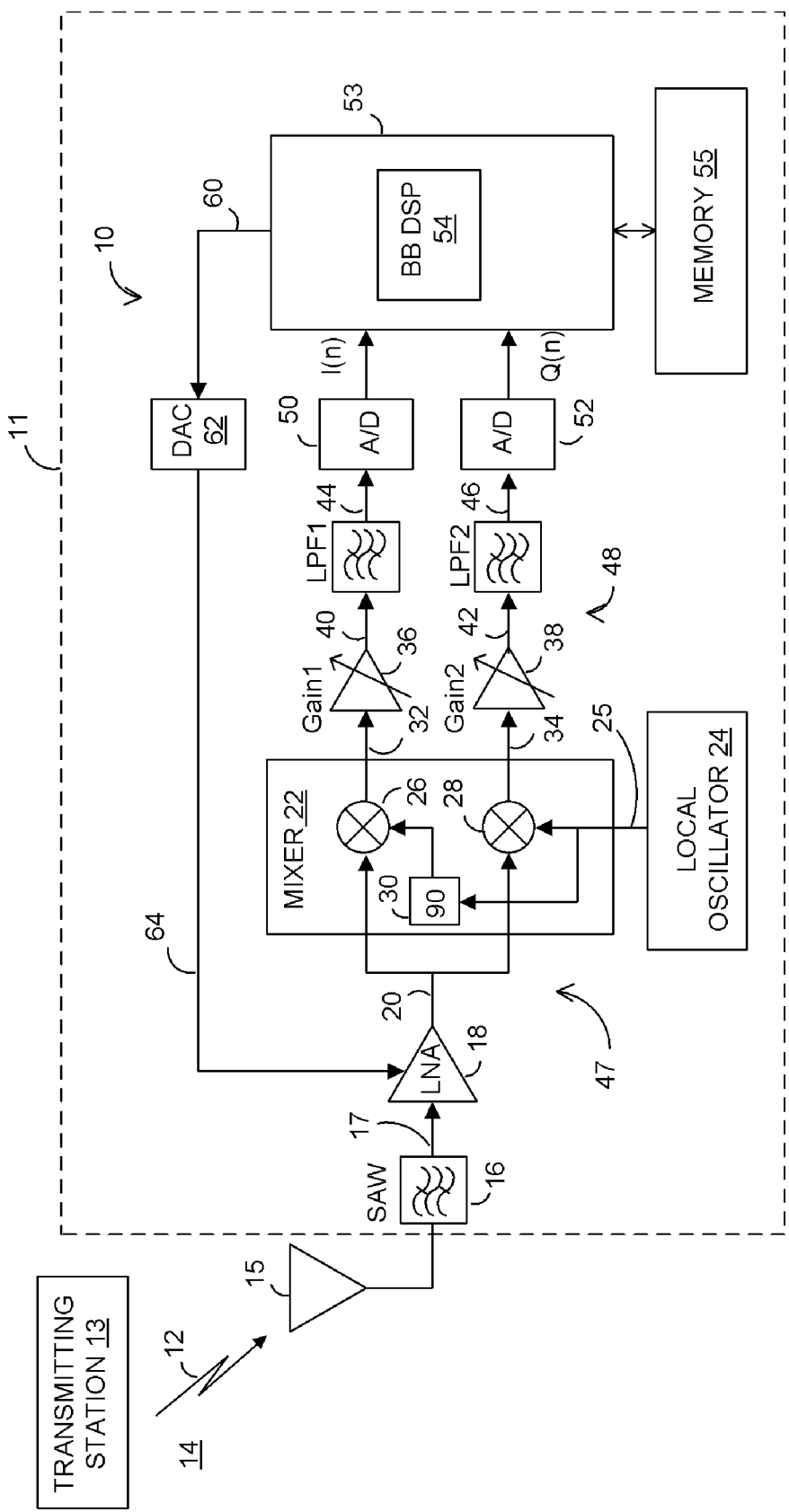
FIG. 1 is a block diagram of a receiver for a wireless device, according to some embodiments of the present invention.

With reference to FIG. 1, there is illustrated a receiver 10, according to some embodiments of the present invention, which may be part of a wireless communication device 11. In some embodiments, the receiver 10 may receive a wireless communication signal 12 transmitted from a station 13 over a wireless medium 14. In some embodiments, the wireless communication device 11 incorporating the receiver 10 may be a station (STA), such as a client station, or an access point (AP), with the access point allowing the associated stations, such as the station 13, to have access to one or more external networks, such as the Internet. In FIG. 1, the station 13 is configured to be transmitting station and the wireless communication device 11 is configured to be a receiving station, although both may be capable of both transmission and reception of communication signals. In some embodiments, when the wireless communication device 11 is an access point, there may be multiple stations 13 associated with the access point.

The receiver 10, according to some embodiments of the present invention, may include an antenna 15 for receiving the communication signal 12. A bandpass filter 16 may be coupled to the antenna 15 to filter the received communications signal 12 so as to generate a filtered communication signal 17. In some embodiments, the filter 16 may perform a rough selection of the received band. The bandwidth of the filter 16 may correspond to the total bandwidth assigned to a specific service and therefore may cover multiple channels belonging to the same service. In some embodiments, the filter 16 may be a surface-acoustic-wave (SAW) filter.

A low-noise amplifier (LNA) 18 may be coupled to the bandpass filter 16 to amplify the filtered communication signal 17 so as to generate an amplified communication signal 20. Amplification by the amplifier 18 may result in noise added by later components having less effect on a Signal-to-Noise Ratio (SNR). The received communication signal 12, filtered communication signal 17, and amplified communication signal 20 are passband signals, having a signal envelope to be described hereinafter with respect to FIG. 2.

A complex mixer 22 (also referred to as a down-converter) may be coupled to the amplifier 18 to receive the amplified communication signal 20. The complex mixer 22 may also be coupled to a down-converter local oscillator (LO) 24 to receive an oscillator signal 25. The complex mixer 22 may include an in-phase mixer 26 and a quadrature-phase mixer 28. The in-phase mixer 26 may be coupled to the output of the amplifier 18 and to the output of the oscillator 24 through a phase shifter 30, which may introduce a ninety degree phase shift. The quadrature-phase mixer 28 may be coupled to the output of the amplifier 18 and to the output of the oscillator 24. The complex mixer 22 may convert the amplified communication signal 20 into an in-phase analog baseband signal 32 and a quadrature-phase analog baseband signal 34. The analog baseband signals 32 and 34 form a complex analog baseband signal. In some embodiments, the oscillator 24 may be a voltage controlled oscillator (VCO).

In some embodiments, a pair of adjustable gain amplifiers 36 and 38 (having amplifier gains of gains1 and gains2, respectively) may amplify the in-phase and quadrature-phase baseband signals 32 and 34 to generate amplified baseband signals 40 and 42, respectively. In some embodiments, a pair of low-pass filters LPF1 and LPF2 may filter the baseband signals 40 and 42 to produce filtered in-phase and quadrature-phase analog baseband signals 44 and 46, respectively. The signal 44 and 46 are analog, down-converted, baseband, time domain signals. In some embodiments, the low-pass filters LPF1 and LPF2 may provide a selection of desired frequency bands for a specific transmitting station, such as the transmitting station 13. In some embodiments, the filters LPF1 and LPF2 may also reduce adjacent channel interference as well as noise.

The receiver 10, according to some embodiments of the present invention, may be defined as having front-end circuitry or passband circuitry 47 including the amplifier 18 and the mixer 22. The front-end circuitry 47 receives the communication signal 12 from the antenna 15 and generates the analog baseband signals 32 and 34. In some embodiments, the front-end circuitry may include the filter 16. In some embodiments, the front-end circuitry 47 may include additional or less components. For example, in some embodiments, the down-conversion may occur in multiple stages (multiple mixers and filters), with a first mixer converting the received passband signal to an intermediate frequency signal, and then a second mixer converting the intermediate frequency signal to a baseband signal. Hence, the front-end circuitry 47 may include intermediate frequency circuitry. The receiver 10 may be defined as having a receive-signal path or chain having radio frequency (RF) circuitry 48, which may include the filter 16, amplifier 18, mixer 22, amplifiers 36 and 38, and filters LPF1 and LPF2. The RF circuitry 48 receives the communication signal 12 from the antenna 15 and generates the baseband signals 44 and 46. In some embodiments, the RF circuitry 48 may have more or less components.

The receiver 10, according to some embodiments of the present invention, may include a pair of analog-to-digital converters (ADCs) 50 and 52 (also referred to as "samplers") coupled to the filters LPF1 and LPF2, respectively, to receive the analog baseband signals 44 and 46, respectively. The ADCs 50 and 52 sample these analog baseband signals 44 and 46 to generate in-phase and quadrature-phase digital baseband signals I(n) and Q(n), respectively, where n is a sample index. In other words, the ADCs 50 and 52 may convert the analog baseband signals 44 and 46 into digital values (samples) that are discrete in time and amplitude. Digital baseband circuitry 53, such as a baseband (BB) signal processor 54, may be coupled to the ADCs 50 and 52 to receive the samples of the digital baseband signals I(n) and Q(n). In some embodiments, the signal processor may be a digital signal processor (DSP). A memory 55 may be coupled to and accessible by the signal processor 54.

The processor 54, according to some embodiments of the present invention, in response to the digital baseband signals I(n) and Q(n), generates a digital envelope compensation signal 60. The digital envelope compensation signal 60 may be in part a function of the amplitude of a baseband envelope formed by the digital baseband signals I(n) and Q(n). The digital baseband signals I(n) and Q(n) define instantaneous values of the baseband envelope. This baseband envelope is derived from a corresponding passband envelope of the communication signals 12, 17 and 20, as will be described in detail hereinafter. A digital-to-analog converter (DAC) 62 is coupled to the processor 54 to receive the digital envelope compensation signal 60 and to convert it to an analog envelope compensation signal 64. In some embodiments, the DAC 62 may also include a low pass filter, such as an RC circuit, to reduce quantizing errors. In other embodiments, such a low pass filter may not be needed. The digital and analog envelope compensation signals 60 and 64 may also be referred to as "digital linearity compensation" and "analog linearity compensation" signals, respectively.

The analog envelope compensation signal 64 from the DAC 62 may be fed back to the front-end circuitry 47. More specifically, in some embodiments, the analog envelope compensation signal 64 may be fed back to one or more amplifiers in the signal receive path of the RF circuitry 48. In some embodiments, the amplifier (LNA)18 may be coupled to the DAC 62 to receive the analog envelope compensation signal 64. In some embodiments, the complex mixer 22 may be coupled to the DAC 62 to receive the analog envelope compensation signal 64. In some embodiments, the amplifier 18 and the complex mixer 22 both may be coupled to the DAC 62 to receive the analog envelope compensation signal 64. Other combination of components of the front-end circuitry 47 may be coupled to the DAC 62. As will be described hereinafter, during calculation of coefficients for a function to determine the digital envelope compensation signal 60, the processor 54, the DAC 62, and the RF circuitry 48, and the ADCs 50 and 52 may form a feedback loop.

Figure 2:
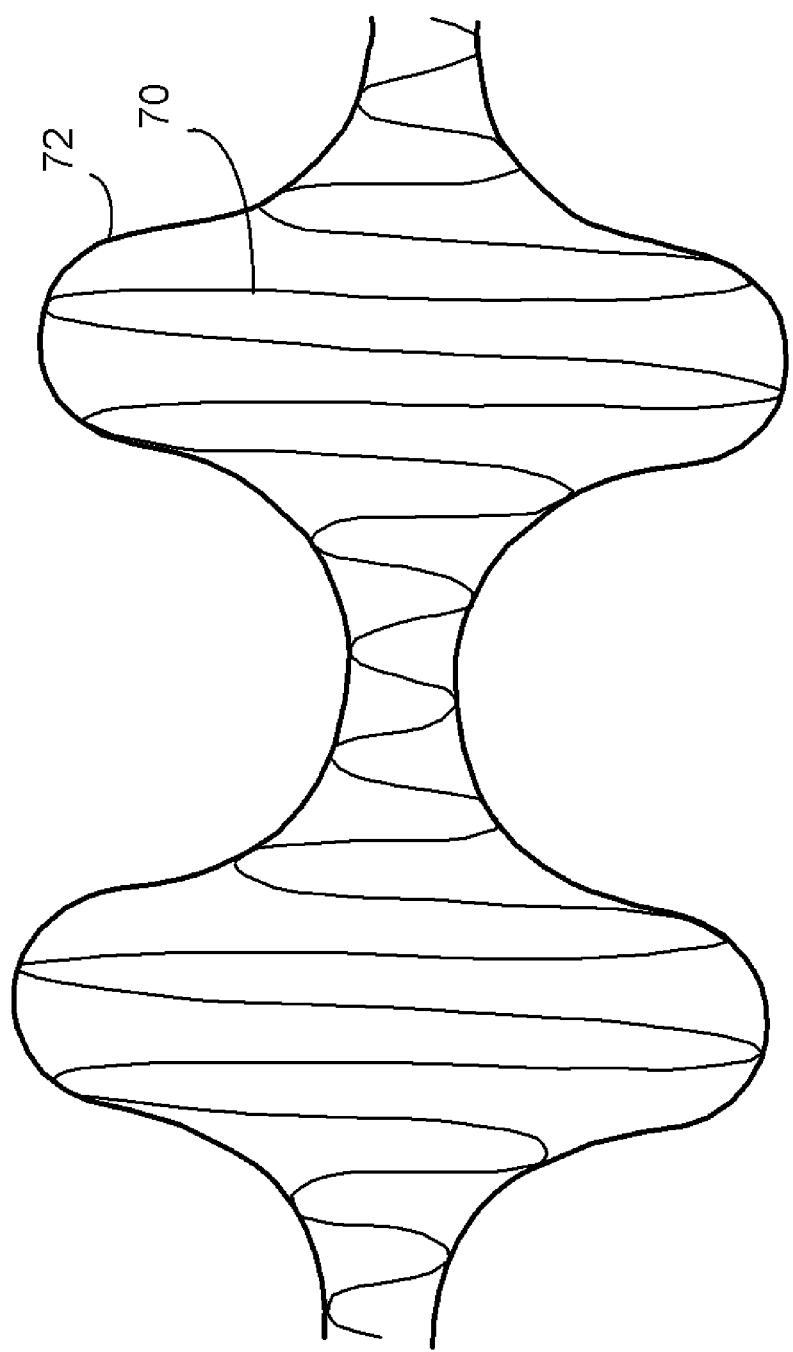
FIG. 2 is a diagram of an envelope varying radio frequency (RF) signal that may occur on an output node of an amplifier, according to some embodiments of the present invention.

Referring to FIG. 2, there is illustrated the amplified communication signal 20 generated at the output of the amplifier 18 of FIG. 1. The communication signal 20, a passband signal, has an RF signal waveform 70 with the maximum amplitudes of the RF signal waveform defining a passband envelope 72. The communication signal 20 may include, for example, an amplitude modulated (AM) signal, a signal having some other form of envelope modulation, a constant amplitude output signal that may experience changes in power level, and/or any other form of RF signal for which the. passband envelope 72 may vary with time. The digital baseband signals I(n) and Q(n) received by the processor 54 have amplitudes that substantially reproduce this passband envelope 72. Consequently, the amplitudes of the digital signals I(n) and Q(n) may define a baseband envelope, with this baseband envelope corresponding to the passband envelope 72.

Referring back to FIG. 1, the communication signal 12, as it is processed by the front-end circuitry 47, may be subjected to distortions because of nonlinearities in transistor characteristics of the transistors (e.g., transconductances of transistors and/or cross products) in the amplifier(s) of the front-end circuitry 47. This may be characterized by the quasi-static characteristics of the transistors. The deterioration of the performance due to nonlinearities, as reflected by performance parameters to be described hereinafter, may increase upon the presence of blockers (large unwanted in-band or out-of-band signals). With some amplifiers, the greater the amplitudes of the digital signals I(n) and Q(n), the greater the resulting distortion. Such distortions caused by nonlinearities will now be described in more detail with respect to the amplifier 18.

Figure 3:
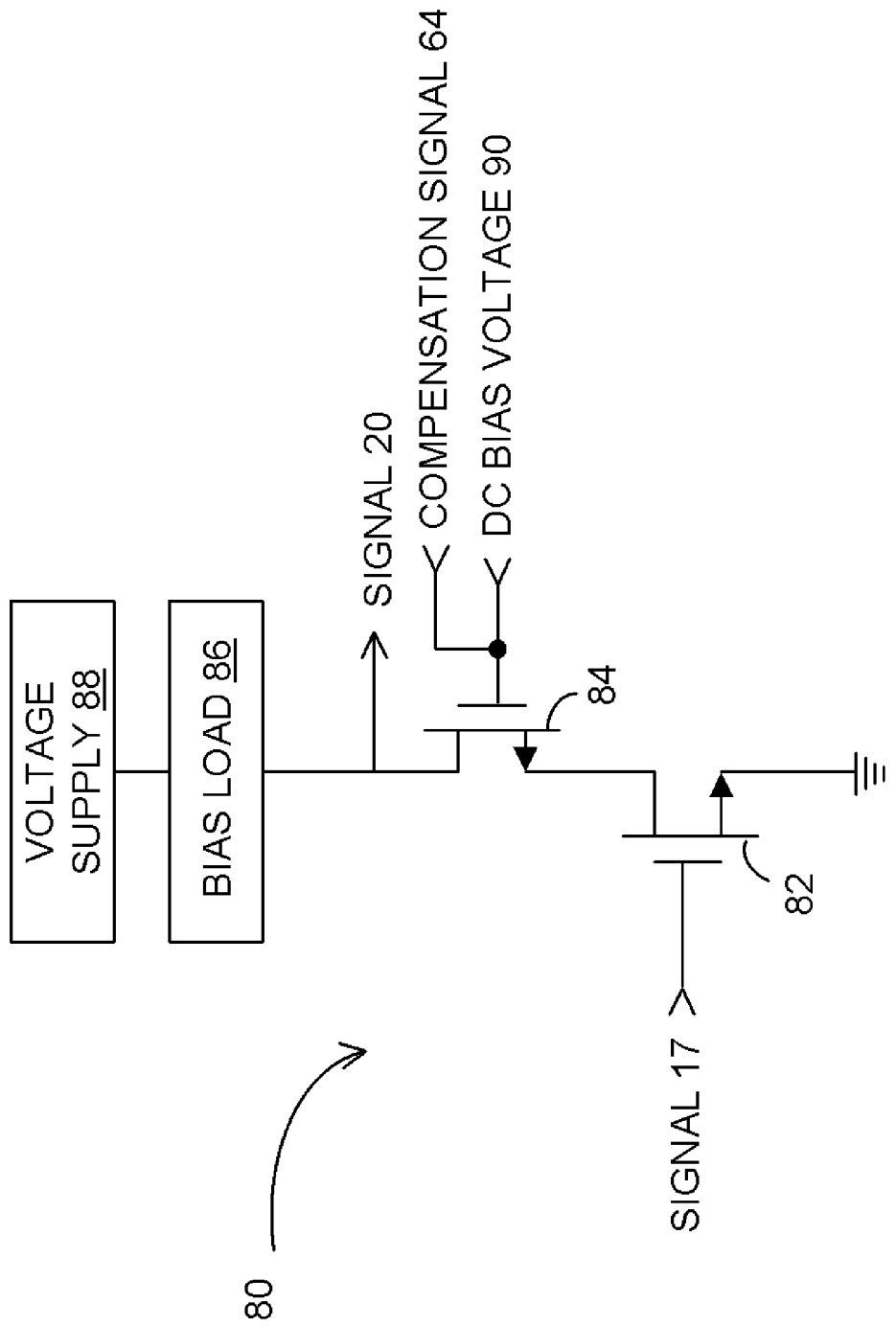
FIG. 3 is a schematic diagram of one embodiment of an amplifier of FIG. 1, according to some embodiments of the present invention.

Referring to FIG. 3, the amplifier 18 of FIG. 1, according to some embodiments of the present invention, may be a field effect transistor (FET) cascode amplifier, such as the illustrative cascode amplifier 80 having a pair of FETs 82 and 84 coupled together in a cascode configuration. For example, both FET 82 and FET 84 may be N-type FETs (NFETs). A gate of FET 82 may be coupled to the filtered communication signal 17 of FIG. 1. A source of FET 82 may be connected to ground, and a drain of FET 82 may be coupled to a source of the FET 84. The communication signal 17, inputted at the gate of FET 82, may be amplified by FET 82 and FET 84, and may be outputted at the drain of FET 84 as the amplified communication signal 20. The drain of FET 84 may also be coupled to a bias load (load element) 86, which may be a resistor or inductor. The bias load 86 may be coupled to a voltage supply 88.

Each of the FETS 82 and 84 may be defined to have a transconductance Gfs, which is the extent to which its drain current $I_D$ changes in response to a change in gate-to-source voltage $V_{GS}$, as defined by the following equation: $Gfs = dI_D/dV_{GS}$. This transconductance Gfs may generate one of the previously-described nonlinearities. However, the original causes of the nonlinearity of the receiver 10 of FIG. 1 may be due to one or more factors (e.g., nonlinear output resistance and/or nonlinear $I_D$ versus $V_{GS}$). In some embodiments, the DAC 62 may be coupled to the gate of the transistor 84 to add the analog envelope compensation signal 64 to a DC bias voltage 90 at the gate of the transistor 84, as shown in FIG. 3. The amplifier 18 may take different forms, and the amplifier 80 is merely intended to illustrate one example.

Figure 4:
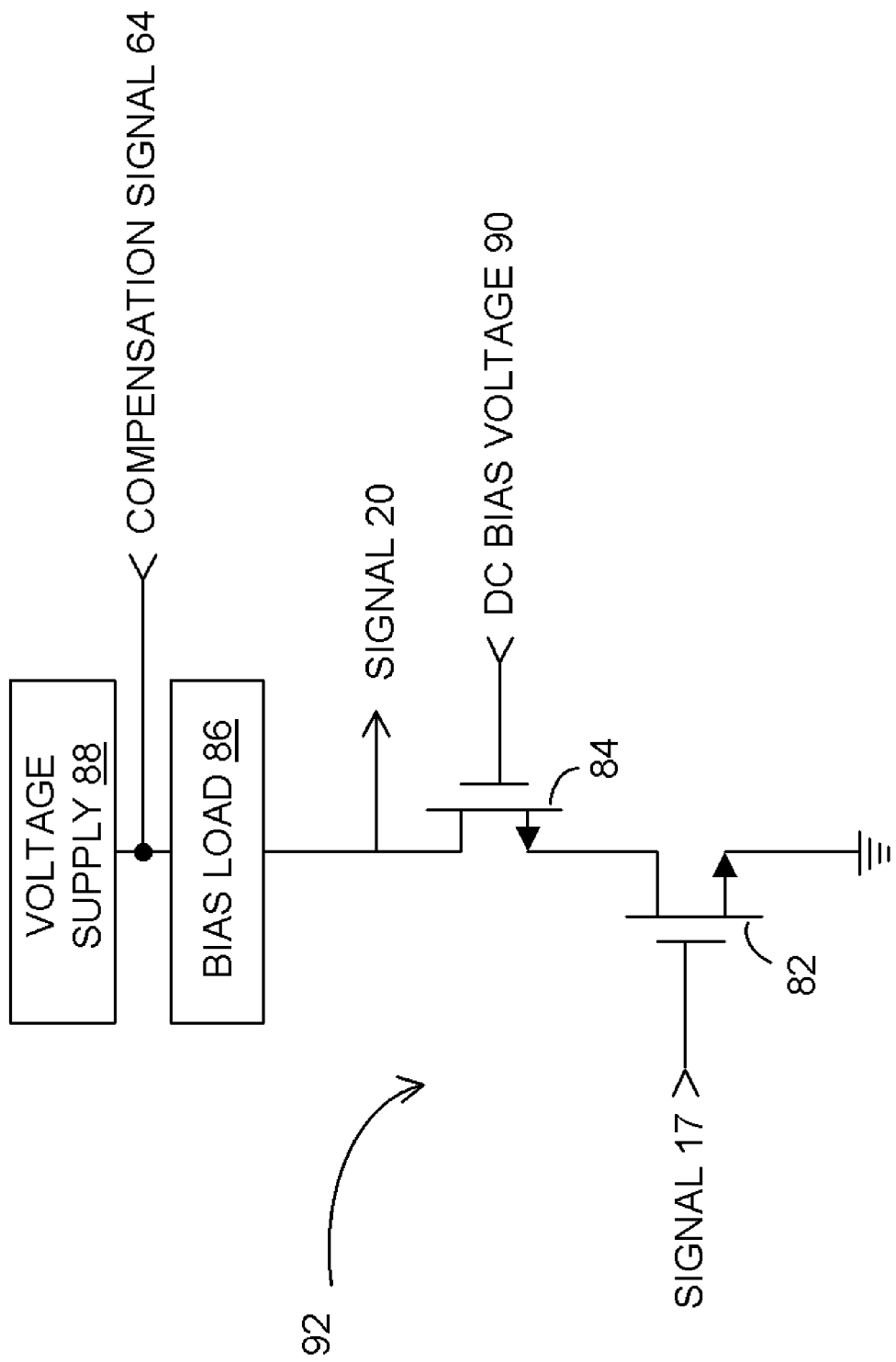
FIG. 4 is a schematic diagram of another embodiment of the amplifier of FIG. 1, according to some embodiments of the present invention.

Another embodiment of the amplifier 18 of FIG. 1 is illustrated in FIG. 4 as an amplifier 92. The amplifier 92 is substantially identical to the amplifier 80 of FIG. 3, except for the location at which the analog envelope compensation signal 64 is connected. Hence, the reference numbers remain the same and the amplifier 92 will not be described. In the amplifier 92, the analog envelope compensation signal 64 may be coupled to an output of the voltage supply 88 so that the voltage of the analog envelope compensation signal 64 adds to or subtracts from the voltage provided by the voltage supply 88. In other words, the analog envelope compensation signal 64 may bias the drain of the transistor 84, thereby providing another way to reduce nonlinearity in the amplifier 92.

To the extent that there are nonlinearities in the transconductances of the FETs 82 and/or 84 of FIGS. 3 and 4, the passband envelope 72 may be modified or distorted by these nonlinearities and deviate from an ideal envelope waveform not affected by such nonlinearities. In one illustrative example, the larger the amplitudes of the communication signal 17, the greater the nonlinearities may be, in that operation of the amplifier 80 or 92 may deviate from a more linear range that it has with smaller amplitudes of the communication signal 17. The greater the nonlinearities, the more intermodulation products that may be generated.

In some embodiments, the analog envelope compensation signal 64 may be used for controlling or modulating bias voltage(s) and/or current(s) to one or more stages of the mixer 22 of FIG. 1. For example, the analog envelope compensation signal 64 may be added the local oscillator 24 of FIG. 1 or may be added to the bias current of a transconductor for the mixer 22. The mixer 22 may include the transconductor, which is an amplifier whose output is a current, and a switch. Hence, adjusting the mixer 22 with the analog envelope compensation signal 64 may compensate for the nonlinearity of the components in the front-end circuitry 47, such as the nonlinearity in the amplifier 18. Moreover, the mixer 22 may also contribute to the nonlinearity of the front-end circuitry 47.

Figure 5:
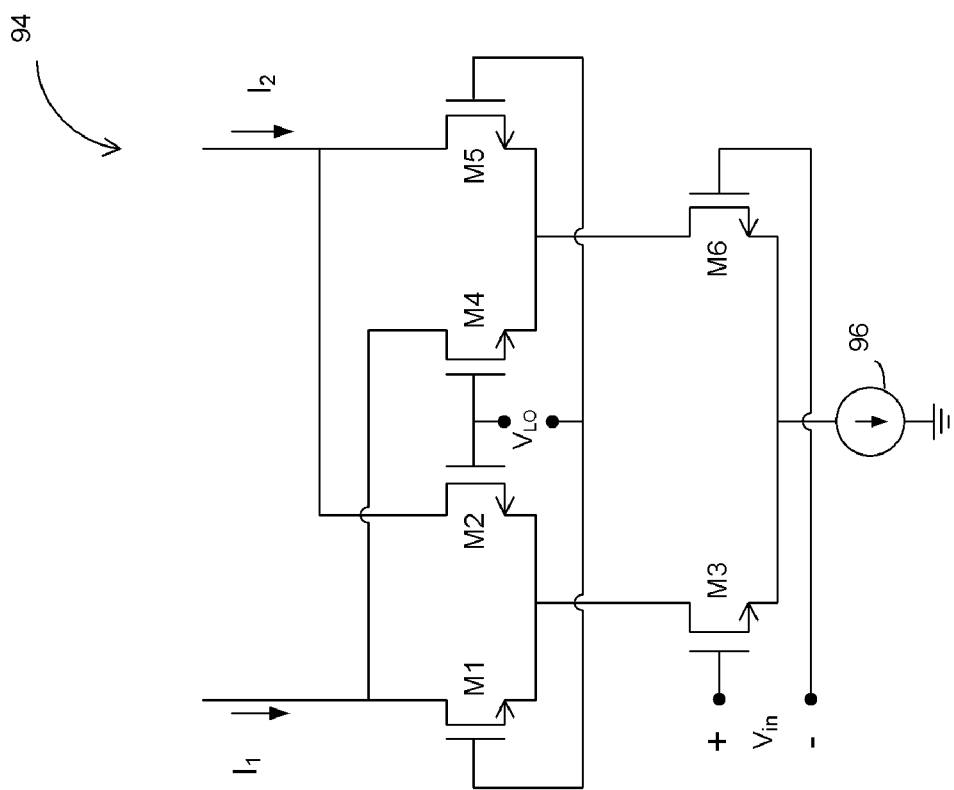
FIG. 5 is a schematic diagram of one embodiment of a mixer of FIG. 1, according to some embodiments of the present invention.

Referring to FIG. 5, one illustrative example of the mixer 26 or 28 of FIG. 1 is shown, which is designated as a mixer 94; however, the mixer 94 may take many different forms. The mixer 94 may be a complementary metal oxide semiconductor (CMOS) Gilbert cell, with FETs M1-M6. FETs M1 and M4 may have their drains coupled to current I1 and FETs M2 and M5 may have their drains coupled to current I2. The sum of the currents I1 and I2 may be current Ibias, which may be selected for gain, linearity, and noise. The sources of FETs M1 and M2 may be coupled to the drain of FET M3 and the sources of FETs M4 and M5 may be coupled to the drain of FET M6. The sources of FETs M3 and M6 may be coupled to a current source 96. The RF voltage Vin is the amplified communication signal 20 shown in FIG. 1 and may be coupled to the gates of the FETs M3 and M6. Biasing voltage $V_{LO}$ may be coupled to the gates of FETs M1, M2, M4 and M5. In some embodiments, the analog envelope compensation signal 64 of FIG. 1 may be added to and becomes part of the biasing voltage $V_{LO}$. Without the analog envelope compensation signal 64, the biasing voltage $V_{LO}$ may be a series of equal amplitude digital pulses centered about a positive direct current voltage. These digital pulses may have a frequency chosen according to the frequency to which the RF signal (signal 20) is being converted to by the mixer 94. For a direct conversion receiver such as shown in FIG. 1, the frequency of the pulses may equal the frequency of the RF signal. If the mixer 94 converts the RF signal to an intermediate frequency (IF), then the difference between the RF frequency and the pulse frequency may be the IF frequency. The analog envelope compensation signal 64 may modify the amplitudes of these digital pulses so that the amplitudes vary with the analog envelope compensation signal 64. The output of the current source 96 may be the analog baseband signal 32 or 34 of FIG. 1.

Referring to FIGS. 1-5, the receiver 10, according to some embodiments of the present invention, implements a substantially linear receiver 10 by substantially linearizing at least one or more RF amplifiers in the front-end circuitry 47 by employing the digital envelope compensation signal 60. After conversion by the DAC 62, the analog envelope compensation signal 64 may be used for controlling or modulating bias voltage(s) and/or current(s) in one or more RF amplifiers and/or the mixer, such as described with respect to the amplifiers 80 and 92 of FIGS. 3 and 4, respectively. Generally, by controlling or modulating the previously-mentioned bias voltage(s) and/or current(s), the analog envelope compensation signal 64 may introduce complementary nonlinearity to the passband envelope 72 of FIG. 2 to reduce or cancel the nonlinearity that would exist in these receive-signal components without such compensation. The value of the envelope compensation signal 64 may be derived from and is a function of the baseband envelope (amplitudes of digital signals I(n) and Q(n)), so that the amount of adjustment or compensation of the passband envelope 72 caused by the analog envelope compensation signal 64 substantially varies with the amount of distortion of the passband envelope 72 caused by the non-linearities, but in opposite amplitude directions. When the amount of compensation for the passband envelope 72 is combined with the amount of nonlinearity distortion in the passband envelope 72, the two substantially cancel or reduce the effects of each other, leaving a passband envelope 72 with less distortion.

Figure 6:
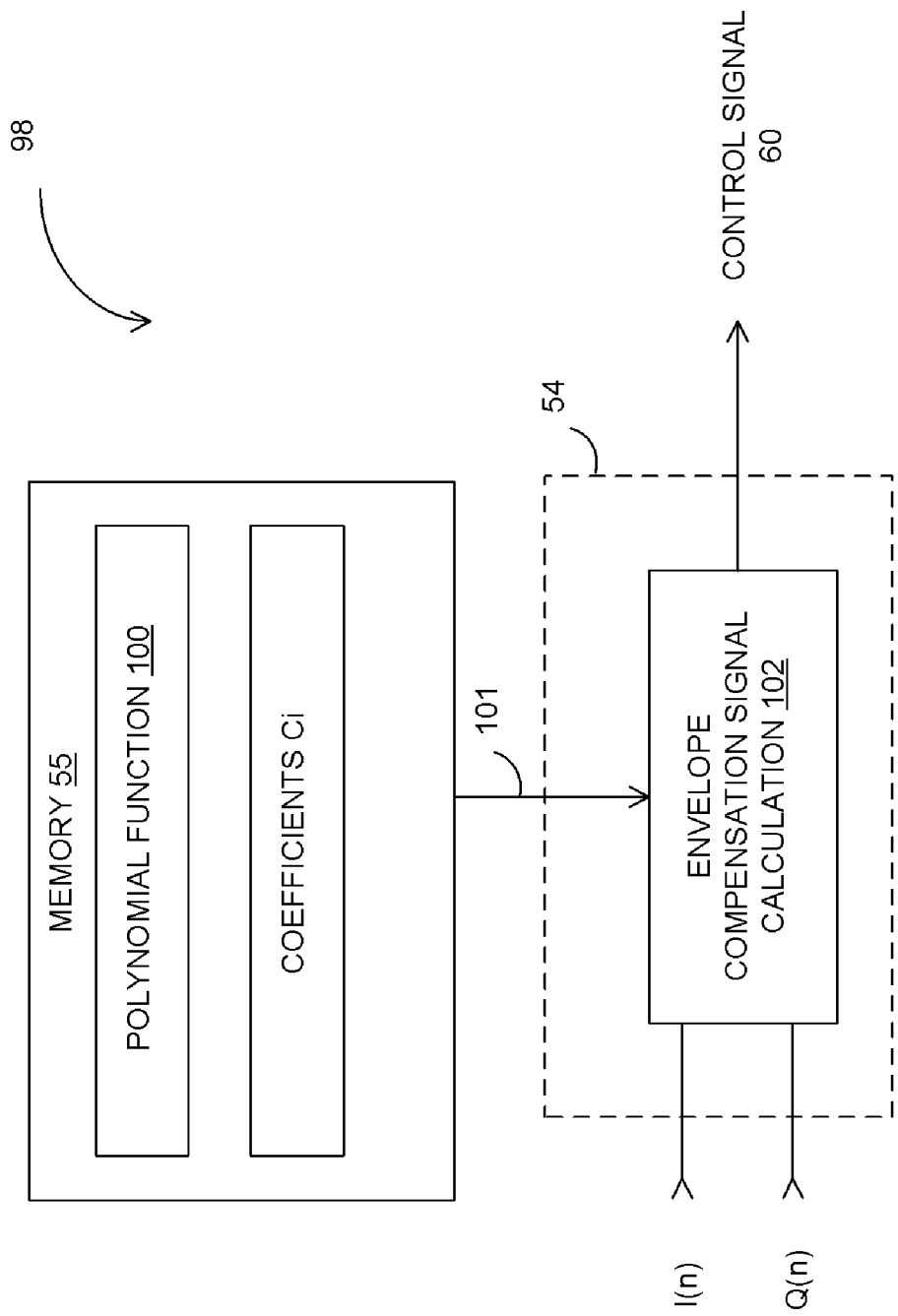
FIG. 6 is a diagram and flow chart of an envelope compensation signal computation routine, according to some embodiments of the present invention.

Referring to FIG. 6, there is illustrated an envelope compensation signal computation routine 98, according to some embodiments of the present invention. In this routine 98, the calculation of the digital envelope compensation signal 60 may be undertaken by the processor 54 in response to the digital baseband signals I(n) and Q(n). The memory 55 may contain a polynomial function 100 for calculating the digital envelope compensation signal 60, such as the following power series equation:

$$\text{envelope compensation signal}(n) = C1 + C2(\text{Vampl}) + C3(\text{Vampl}^2) + C4(\text{Vampl}^3) + \quad \text{Equation 1}$$

where C1, C2, C3, . . . are adjustable coefficients, Vampl is the baseband amplitude, and envelope compensation signal(n) is the digital envelope compensation signal 60. In some embodiments, the amplitude Vampl may be $\text{sqrt}(I(n)^2 + Q(n)^2)$, where n is the digital sample index and sqrt stands for square root. The coefficients Ci may be stored in the memory 55. In some embodiments, the coefficients may be arranged in a look-up table in the memory 55. In an operation 101, the processor 54 may access the memory 55 to obtain the polynomial function 100 and coefficients Ci and, upon receiving a pair of digital baseband signals I(n) and Q(n), may execute Equation 1 in an envelope compensation signal calculation operation 102, with each pair of digital samples of signals I(n) and Q(n) defining a complex amplitude Vampl. Other functions may be used and the power series Equation 1 is merely illustrative of one example.

The power series of Equation 1, according to some embodiments of the present invention, generally may be used to proximate a desired mathematical function for a memoryless system. If the receiver 10 is perfectly linear (no nonlinearities to correct), then the coefficients of Equation 1 may be zero; hence, the digital envelope compensation signal 60 would be zero. If the nonlinearity is due to an output resistance alone, it is likely that a baseband amplitude signal (linear term only or substantially linear) may be supplied by the processor 54 as the digital envelope compensation signal 60. In other words, the coefficients C3 and higher may be zero in this case. In the general case, where multiple distortions are being compensated for, a squared term, a cubic term and other terms for the polynomial function 100 may be needed. The desired polynomial function 100 to accommodate the varying amplitude may be achieved by training or calibration. The calculation of the coefficients $C_i$ of the polynomial function 100 using training will be described.

Figure 7:
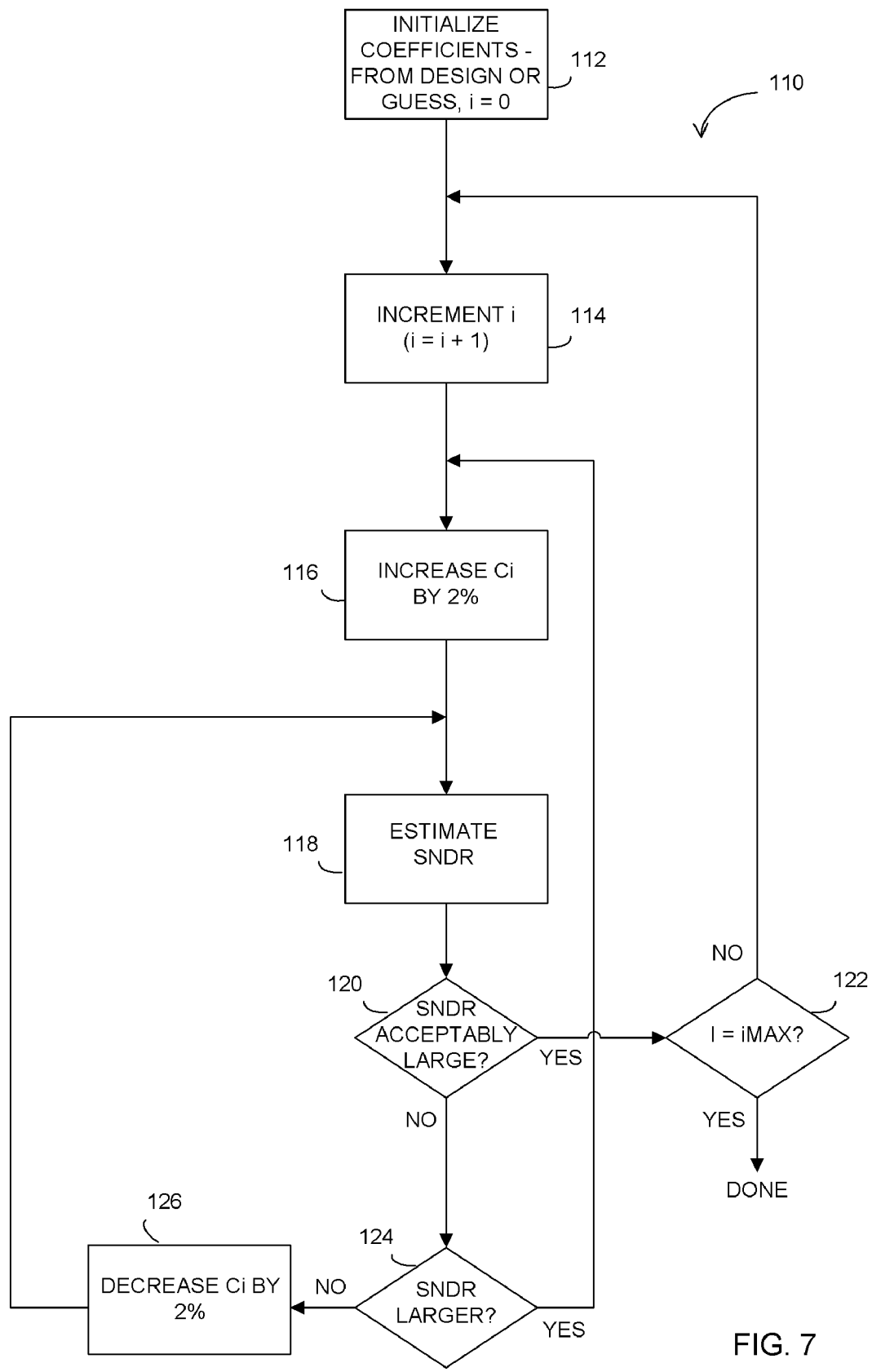
FIG. 7 is a flow chart of a coefficient computation routine executed by the processor of FIG. 1, according to some methods of the present invention.

Referring to FIG. 7, there is illustrated a flow chart of a coefficient computation routine 110, according to some embodiments of the present invention. The coefficient computation routine 110 may be stored in memory 55 of FIG. 1 and accessed and executed by the signal processor 54 of FIG. 1. The coefficient computation routine 110 may be used to determine the coefficients $C_i$ of Equation 1. More specifically, coefficient computation routine 110 may use a search algorithm to search for a desired set of coefficients $C_i$ for computing Equation 1 that will substantially reduce distortion caused by the previously described nonlinearities.

Starting with an initial set of coefficients, this search algorithm may vary the coefficients by a predetermined amount, one at a time, while monitoring a performance parameter which provides an estimate of non-linearity, to determine if distortion has been reduced. If the distortion is made worse by the predetermined amount of variation, then the search algorithm may back up and select either the prior coefficient value or some coefficient value determined by varying the coefficients in the opposite direction. In some embodiments, the coefficient computation routine 110 may use a linear search algorithm, as illustrated in FIG. 7, in an adaptive process wherein the coefficients may be varied in a linear manner. However, many other types of search algorithms may be used and this linear search algorithm is merely illustrative of one example. The coefficient computation routine 110 will now be described in more detail.

In an operation 112, upon powering up the receiver 10 of FIG. 1, the processor 54 of FIG. 1 may access an initialization table in the memory 55 to obtain an initial set of one or more initial coefficients to start the coefficient search process, which determines the desired set of coefficients $C_i$ for Equation 1. In some embodiments, computer simulations with reasonable transistor models may be used to reveal the approximate mathematical relationship desired and to establish the initial set of coefficients. In the operation 112, the routine 110 may start with a coefficient counter for the coefficients $C_i$ set to $i=0$. At an operation 114, the coefficient counter may be incremented by 1, so that $i=i+1$. At an operation 116, the coefficient $C_i$ may be increased by 2%, although other amounts of variation may be used.

At an operation 118, a performance parameter may be measured by the signal processor 54 of FIG. 1 by sending a training signal and then computing the power series Equation 1 with the coefficient having been increased at the operation 116 and with the other coefficients not having been increased. In some embodiments, as illustrated in FIG. 7, the measured performance parameter may be signal-to-noise plus distortion ratio (SNDR). In some embodiments, the signal processor 54 may use signal-to-noise ratio (SNR) or, bit error rate (BER), or some other measures which are sensitive to the distortion caused by the nonlinearities introduced in the RF circuitry 48. When SNDR is used as the performance parameter in the operation 118, SNDR may be increased (if distortion decreases, SNDR will increase).

In the operation 118, the transmitting station 13 of FIG. 1 may send a communication signal 12 in the form of the training signal to the receiver 10 of FIG. 1. In some embodiments, the training signal may include two intermodulation intercept point (IP) tones, which are referred to as iIP2 and iIP3. An estimate of the SNDR may be obtained by a channel estimation using the training signal. The processor 54 of FIG. 1 may have an undistorted version of the training signal stored in the memory 55 of FIG. 1, and may subtract it from the received training signal, with the difference between the two signals being noise plus distortion. The training signal may also be used for other purposes, such as equalization. In some embodiments, the processor 54 of FIG. 1 may undertake these channel improving functions prior to initiating the coefficient computation routine 110.

In an operation 120, the measured SNDR parameter may be compared with a predetermined level to determine if the SNDR is acceptably large. If yes, then the routine may branch to an operation 122. At operation 122, the routine 110 may determine if $i=i_{max}$, with $i_{max}$ being the maximum number of coefficients processed by the routine 110. If yes, the routine 110 is done processing coefficients. If no, the routine 110 loops back to the operation 114, where processing of the next coefficient may be undertaken. If in operation 120 the SNDR is not acceptably large, then the routine 110 may proceed to an operation 124.

At operation 124, there may be a decision as to whether the estimated SNDR determined in operation 118 is larger than the prior determined SNDR value. If the SNDR determined in operation 118 decreased due the coefficient $C_i$ being increased at operation 116, then the decision in operation 124 may be made to proceed to an operation 126, where the coefficient $C_i$ may be decreased by 2% (head in the other direction). If the SNDR determined in operation 118 increased due the coefficient $C_i$ being increased at the operation 116, then the decision in operation 124 may be made to loop back to the operation 116 where the coefficient $C_i$ again may be increased. Likewise, if the SNDR determined in operation 118 decreased due the coefficient $C_i$ being decreased at the operation 126, then the decision in operation 124 may be made to proceed to an operation 116, where the coefficient $C_i$ may be increased by 2% (head in the other direction). If the SNDR determined in operation 118 increased due the coefficient $C_i$ being decreased at the operation 126, then the decision in operation 124 may be made to proceed to the operation 126 where the coefficient $C_i$ again may be decreased. If after a predetermined number of iterations (not shown), the SNDR at operation 120 does not meet the desired SNDR threshold in operation 120, then the routine 110 may proceed to the operation 122. Alternatively, the coefficients $C_i$ may be increased or decreased until the distortion starts increasing (SNDR starts going down). The determined coefficients may be stored in a look-up table in the memory 55 and accessed for use by the processor 54 as needed.

In summary, the search algorithm starts with one or more initial coefficients based upon existing knowledge of the receiver 10 and the coefficients may be changed by the search algorithm as better knowledge of the receiver is obtained by using the training signal. In some embodiments, it may be determined that one coefficient is most important and can be varied while estimating the SNDR. In other embodiments, as illustrated in FIG. 7, even if more coefficients are needed to produce a better result, it may be possible to vary them one at a time while estimating SNDR, and then repeating for the next coefficient. In general, the search may end after the incremental improvement in performance has settled below a threshold. In other embodiments, e.g. where a higher degree of precision is desired, the search may continue and end only after a set of coefficients yielding a performance within a desired threshold level. In still other embodiments, e.g. where a relative lower degree of precision is sufficient, the search may end after a predetermined number of iterations.

As described above, in some embodiments, the SNDR may be monitored while employing a function of the amplitude of the baseband signal to vary a bias voltage and/or current in an amplifier and/or mixer to improve linearity, so as to establish desired coefficients to reduce distortion. In some embodiments, the coefficients of the power series may be set and may stay constant. Thereafter, the instantaneous digital signals I(n) and Q(n) may be processed with the polynomial function 100 of FIG. 6 using the determined constant coefficients. However, the non-linearity of the components of the front-end circuitry 47 may drift, for example, with temperature. Hence, the coefficients in the memory 55 may be updated. The coefficient may be checked over time with a training signal or pilot tone and may be updated with additional computations using the routine 110. The newly determined coefficients may be written to the memory 55.

The receiver 10 of FIG. 1, according to some embodiments of the present invention, may increase linearity with any implementation, but may be particularly beneficial to scaled complementary metal oxide semiconductor (CMOS) receivers where linearity may be particularly poor due to short channel affects, and where the power supply voltage may be small because of breakdown and reliability, which may result in less headroom and worse linearity. Hence, in some embodiments, the receiver 10 may be implemented in a relatively high sensitivity communication chip sets with relatively low-cost CMOS technology, such as scaled CMOS and digital CMOS. The receiver 10 may provide relatively high sensitivity in the presence of blockers.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices.

Some embodiments of the present invention may be implemented in one or a combination of hardware, firmware and software. Embodiments of the invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. In the foregoing detailed description, various features may be occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, invention may lie in less than all features of a single disclosed embodiment.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   a front-end circuitry to generate a baseband signal based at least in part on a received communication signal, with the baseband signal having a signal envelope reflecting at least one nonlinearity of the front-end circuitry, wherein the front-end circuitry includes:
   an amplifier to receive the received communication signal and to generate an amplified communication signal in response to the received communication signal, with the amplifier having the at least one nonlinearity, wherein the amplifier includes at least one amplifier transistor; and
   a mixer coupled to the amplifier to generate the baseband signal based in part on the amplified communication signal, wherein the mixer includes at least one mixer transistor; and
   a digital baseband circuitry, coupled to a gate of the transistor of a selected one of the amplifier and the mixer, to generate an envelope compensation signal based at least in part on the baseband signal and provide the envelope compensation signal to bias the selected one of the amplifier and the mixer to reduce the at least one nonlinearity.

2. The apparatus according to claim 1, wherein the envelope compensation signal is a function of the baseband signal.

3. The apparatus according to claim 2, wherein the signal envelope includes a distortion reflecting the at least one nonlinearity; and the envelope compensation signal introduces into the front-end circuitry a complementary nonlinearity which, when combined with the nonlinearity causing the distortion, reduces the distortion.

4. The apparatus according to claim 1, wherein the digital baseband circuitry, in response to the baseband signal, is arranged to execute a predetermined function based at least in part on the baseband signal to determine the envelope compensation signal.

5. The apparatus according to claim 1, wherein
   the digital baseband circuitry is a signal processor which generates the envelope compensation signal in the form of a digital envelope compensation signal; and
   the apparatus further comprises a digital-to-analog converter coupled between the signal processor and the front-end circuitry to generate an analog envelope compensation signal for the front-end circuitry in response to the digital envelope compensation signal.

6. The apparatus according to claim 1, wherein
   the digital baseband circuitry implements an equation having at least one term with an amplitude of the baseband signal as a variable; and the digital baseband circuitry is arranged to compute the equation in response to the baseband signal to generate the envelope compensation signal.

7. The apparatus according to claim 6, wherein the equation includes at least one coefficient multiplying the variable, with the at least one coefficient being selected to reduce the nonlinearity in response to the received communication signal being a training signal.

8. The apparatus according to claim 7, wherein the digital baseband circuitry being coupled to the front-end circuitry forms a feedback loop when the at least one coefficient is selected in response to the training signal.

9. A method, comprising:
generating an amplified communication signal with an amplifier in a front-end circuitry in response to a received communication signal;
generating a baseband signal with a mixer in the front-end circuitry based at least in part on the amplified communication signal, a received communication signal, with the baseband signal including a distortion caused by at least one nonlinearity of the front-end circuitry and the amplifier having the at least one nonlinearity;
generating a nonlinearity compensation signal in a digital baseband circuitry based at least in part on the baseband signal; and
feeding back the nonlinearity compensation signal to the front-end circuitry to reduce the distortion by biasing a selected one of the amplifier and the mixer with the nonlinearity compensation signal, wherein the biasing includes biasing a gate or drain of a transistor of the selected one of the amplifier and the mixer.

10. The method according to claim 9, wherein the nonlinearity compensation signal is a function of the baseband signal.

11. The method according to claim 10, wherein the feeding back of the linearity compensation signal to the front-end circuitry includes introducing a complementary nonlinearity into the front-end circuitry which, when combined with the nonlinearity causing the distortion, reduces the distortion.

12. The method according to claim 9, wherein the generating of the nonlinearity compensation signal includes executing a predetermined function in response to the baseband signal to determine the nonlinearity compensation signal, with the predetermined function being based at least in part on the baseband signal.

13. The method according to claim 9, wherein the generating of the nonlinearity compensation signal in the digital baseband circuitry includes responding to the receipt of the baseband signal by executing an equation having at least one term with an amplitude of the baseband signal as a variable and at least one coefficient multiplying the variable, so as to generate the nonlinearity compensation signal.

14. The method according to claim 13, further comprising, prior to the generating of the nonlinearity compensation signal:
sending a training signal as the received communication signal;
monitoring a performance parameter; and
varying the at least one coefficient based at least in part on the performance parameter to reduce the distortion.

15. The method according to claim 14, further comprising:
feeding back the nonlinearity compensation signal to the front-end circuitry to form a feedback loop when the at least one coefficient is varied.

16. A system, comprising:
at least one omnidirectional antenna to receive a communication signal;
a front-end circuitry, coupled to the omnidirectional antenna, to generate a baseband signal based at least in part on the received communication signal, with the baseband signal having a signal envelope reflecting at least one nonlinearity of the front-end circuitry, wherein the front-end circuitry includes:
an amplifier to receive the received communication signal and to generate an amplified communication signal in response to the received communication signal, with the amplifier having the at least one nonlinearity, wherein the amplifier includes at least one amplifier transistor; and
a mixer coupled to the amplifier to generate the baseband signal based in part on the amplified communication signal, wherein the mixer includes at least one mixer transistor; and
a digital baseband circuitry, coupled to a gate of the transistor of a selected one of the amplifier and the mixer, to generate an envelope compensation signal based at least in part on the baseband signal and provide the envelope compensation signal to bias the selected one of the amplifier and the mixer to reduce the at least one nonlinearity.

17. The system according to claim 16, wherein the envelope compensation signal is a function of the baseband signal.

18. The system according to claim 17, wherein the signal envelope includes a distortion reflecting the at least one nonlinearity; and the envelope compensation signal introduces into the front-end circuitry a complementary nonlinearity which, when combined with the nonlinearity causing the distortion, reduces the distortion.

19. A machine-readable medium having instructions stored thereon that, when executed, cause a machine to perform operations comprising:
generating an amplified communication signal with an amplifier in a front-end circuitry in response to a received communication signal;
generating a baseband signal with a mixer in the front-end circuitry based at least in part on the amplified communication signal
receiving the baseband signal outputted from the front-end circuitry, with the baseband signal including a distortion caused by at least one nonlinearity of the front-end circuitry, the amplifier having the at least one nonlinearity;
generating a nonlinearity compensation signal based at least in part on the baseband signal; and
outputting the nonlinearity compensation signal so that it may be fed back to the front-end circuitry to reduce the distortion by biasing a selected one of the amplifier and the mixer with the nonlinearity compensation signal, wherein the biasing includes biasing a gate or drain of a transistor of the selected one of the amplifier and the mixer.

20. The machine-readable medium according to claim 19, wherein the instructions are adapted to enable the machine to perform the operation of generating the nonlinearity compensation signal by executing a predetermined function in response to the baseband signal to determine the nonlinearity compensation signal, with the predetermined function being based at least in part on the baseband signal.

21. The machine-readable medium according to claim 20, wherein the instructions are adapted to enable the machine to perform the operation of adjusting the baseband signal to include executing an equation having at least one term with an amplitude of the baseband signal as a variable and at least one coefficient multiplying the variable, so as to generate the nonlinearity compensation signal.

22. The machine-readable medium according to claim 21, further comprising, prior to the operation of generating the nonlinearity compensation signal, the instructions are adapted to enable the machine to perform the operations of monitoring a performance parameter during receipt of a training baseband signal; and varying the at least one coefficient based at least in part on the performance parameter to reduce the distortion.

23. An apparatus, comprising:

a front-end circuitry to generate a baseband signal based at least in part on a received communication signal, with the baseband signal having a signal envelope reflecting at least one nonlinearity of the front-end circuitry, wherein the front-end circuitry includes:

an amplifier to receive the received communication signal and to generate an amplified communication signal in response to the received communication signal, with the amplifier having the at least one nonlinearity, wherein the amplifier includes at least one amplifier transistor and an amplifier voltage supply coupled to an amplifier drain of the amplifier transistor; and a mixer coupled to the amplifier to generate the baseband signal based in part on the amplified communication signal, wherein the mixer includes at least one mixer transistor and a mixer voltage supply coupled to a mixer drain of the mixer transistor; and a digital baseband circuitry, coupled to the drain of the transistor of the selected one of the amplifier and the mixer, to generate an envelope compensation signal based at least in part on the baseband signal and provide the envelope compensation signal to bias a voltage of the drain of the selected one of the amplifier and the mixer to reduce the at least one nonlinearity.

* * * * *

UNITED STATES PATENT AND TRADEMARK OFFICE
CERTIFICATE OF CORRECTION

PATENT NO.      : 7,627,060 B2                                       Page 1 of 1
APPLICATION NO. : 11/386199
DATED           : December 1, 2009
INVENTOR(S)     : Stewart S. Taylor It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 925 days.

Signed and Sealed this

Second Day of November, 2010

David J. Kappos
*Director of the United States Patent and Trademark Office*